United States Patent [19]
Quigley et al.

[11] Patent Number: 5,276,366
[45] Date of Patent: Jan. 4, 1994

[54] DIGITAL VOLTAGE LEVEL TRANSLATOR CIRCUIT

[75] Inventors: John H. Quigley, Mesa; James S. Caravella, Phoenix, both of Ariz.

[73] Assignee: Motorola, Inc., Schaumburg, Ill.

[21] Appl. No.: 955,567

[22] Filed: Oct. 2, 1992

[51] Int. Cl.$^5$ .................. H03K 19/0175; H03K 11/20
[52] U.S. Cl. ..................................... 307/475; 307/451; 307/450
[58] Field of Search ........................ 307/450–1

[56] References Cited

U.S. PATENT DOCUMENTS

| | | | |
|---|---|---|---|
| 4,743,782 | 5/1988 | Nelson | 307/450 |
| 4,926,070 | 5/1990 | Tanaica | 307/475 |
| 4,958,091 | 9/1990 | Roberts | 307/479 |
| 5,144,165 | 9/1992 | Dhong | 307/475 |

*Primary Examiner*—Edward P. Westin
*Assistant Examiner*—Andrew Sanders
*Attorney, Agent, or Firm*—Gary W. Hoshizaki; Michael D. Bingham

[57] ABSTRACT

A digital voltage level translator circuit for interfacing circuitry operating at different voltages is described. An inverting digital voltage level translator circuit (11) has an input (12) and an output (13). The input is coupled to a transmission gate (18), an inverter (17), and a gate of a n-channel enhancement MOSFET (22). Transmission gate (18) is enabled by the inverter (17) when the input (12) is at a zero logic level. An output of transmission gate (18) is coupled to a gate of a p-channel enhancement MOSFET (21) and an output of a pull-up circuit (19). A zero logic level at the input (12) enables MOSFET (21) through transmission gate (18) and disables MOSFET (22) generating a one logic level at output (12). A one logic level at the input (12) enables MOSFET (22) transitioning output (13) to a zero logic level. Output (13) to a control input of pull-up circuit (19) and a zero logic level enables pull-up circuit (19) disabling MOSFET (21).

15 Claims, 1 Drawing Sheet

DIGITAL VOLTAGE LEVEL TRANSLATOR CIRCUIT

BACKGROUND OF THE INVENTION

This invention relates, in general, to translator circuits, and more particularly to translator circuits which interface digital circuits operating at different voltage levels.

Integrated circuit technology, in general, is shifting towards lower operating voltages. Wafer processing advances allow for the fabrication of smaller devices which increase transistor densities within a given area. The smaller devices cannot withstand the standard operating voltage used in the industry. For example, CMOS digital circuitry currently operates at 5 volts. In the future this supply voltage standard could drop to a voltage somewhere between 2.7 and 3.3 volts. Other factors besides wafer processing issues such as reduced power dissipation, new semiconductor processes/materials, or battery operated applications may further fuel a push to lower operating voltages.

It is critical that circuits operating at the two different voltage supply standards (3 or 5 volts) can still interface with one another. The new lower voltage standard would be extremely difficult to integrate into mainstream integrated circuit sales if they were not compatible with the current voltage standard. A translation circuit which interfaces circuitry operating at two different voltage levels must meet several requirements to minimize impact it has on a circuit design. Some of these requirements of the translation circuit are 1) speed (must add minimal delay to system), 2) area (must not take up a significant portion of the design), 3) simplicity (the translator must not be a yield problem), and 4) power dissipation. Most translator circuits currently used fail in one or more of these areas. Thus, it would be of great benefit if a translator circuit could be designed which is fast, uses minimal silicon areas, is simple, and does not dissipate an appreciable static current.

SUMMARY OF THE INVENTION

Briefly stated, there is provided a digital level translator circuit having an input which receives an input signal and an output for providing an output signal. The digital level translator circuit receives an input signal of a first voltage level and generates an output signal of a second voltage level. Typically, the first voltage level is substantially less than the second voltage level.

An inverter enables and disables a transmission gate. The inverter has an input and an output. The input of the inverter is coupled to the input signal. The output of the inverter is coupled to a control input of the transmission gate. The transmission gate has an input coupled to the input signal, and an output.

A p-channel enhancement MOSFET has a gate coupled to the output of the transmission gate, a source coupled to a terminal of a power supply, and a drain coupled to the output of the digital level translator circuit. The p-channel enhancement MOSFET drives the output of the digital level translator circuit to a one logic level when enabled.

A n-channel enhancement MOSFET has a gate coupled to the input signal, a source coupled to ground, and a drain coupled to the output of the digital level translator circuit. The n-channel enhancement MOSFET drives the output of the digital level translator circuit to a zero logic level when enabled.

A pull-up circuit is needed to insure that the p-channel enhancement MOSFET is completely disabled when the output of the digital level translator circuit is at a zero logic level. The pull-up circuit has a control input coupled to the output of the digital level translator circuit and an output coupled to the output of the transmission gate. The pull-up circuit is enabled by a low logic level at the output of the digital level translator circuit.

Advantages of the digital level translator circuit are simplicity, reduced silicon area, low power dissipation, and speed.

DETAILED DESCRIPTION OF THE DRAWINGS

Figure 1:
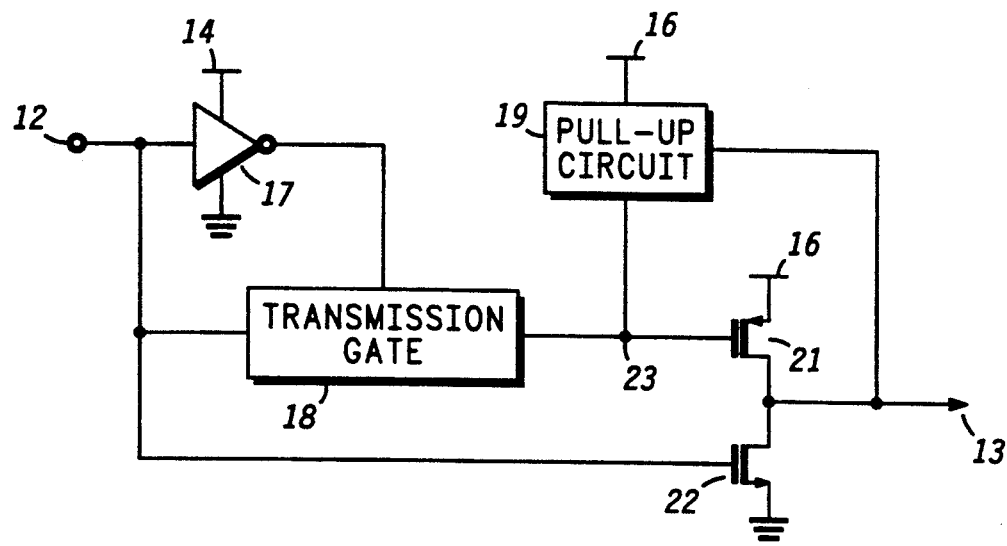
FIG. 1 is a block diagram of a digital voltage level translator circuit in accordance with the present invention.

FIG. 1 is a block diagram of a digital voltage level translator circuit in accordance with the present invention.

An inverting digital voltage level translator circuit 11 is shown in FIG. 1 and has an input 12 and an output 13. Circuit 11 is an inverter which receives a digital logic signal of a first voltage level at input 12 and generates an output of a second voltage level at output 13 for interfacing between digital circuits operating at the first and second voltage levels respectively. Circuit 11 which minimizes a delay path for the voltage level translation also eliminates quiescent currents under static conditions caused by the differing voltage levels. An input signal is coupled to input 12 and in the preferred embodiment is a digital logic signal having a one logic level of approximately 3 volts and a zero logic level of approximately zero volts (or ground). Output signal levels at output 13 of inverting digital voltage level translator circuit 11 are a one logic level of approximately 5 volts and a zero logic level of approximately zero volts (or ground).

An inverter 17 has an input coupled to input 12 of inverting digital voltage level translator circuit 11. An output of inverter 17 is coupled to a control input of a transmission gate 18. Inverter 17 is coupled to a terminal of a first power supply 14. First power supply 14 provides a voltage of approximately 3 volts. In the preferred embodiment, inverter 17 comprises cascade coupled p-channel and n-channel enhancement MOSFET transistors which is well known in circuit design art.

Transmission gate 18 has an input coupled to input and an output coupled to node 23. Inverter 17 enables and disables transmission gate 18. A one logic level at the output of inverter 17 enables transmission gate 18 and a zero logic level disables transmission gate 18. Note, the one logic level at the output of inverter 17 has a maximum voltage of approximately 3 volts which is substantially equal to the level of first power supply 14.

A p-channel enhancement MOSFET 21 has a gate coupled to node 23, a source coupled to a terminal of a second power supply 16, and a drain coupled to output 13 of inverting digital level translator circuit 11. The second power supply provides a voltage of approximately 5 volts. A zero logic level at its gate enables p-channel enhancement MOSFET 21 to drive output 13 to a one logic level of approximately 5 volts which is substantially equal to power supply 16.

A n-channel enhancement MOSFET 22 has a gate coupled to input 12, a source coupled to ground, and a drain coupled to output 13. A one logic level at input 12 enables n-channel enhancement MOSFET 28 generating a zero logic level at output 13. Note, a one logic level from the input signal has a maximum voltage of approximately 3 volts.

A pull-up circuit 19 disables p-channel enhancement MOSFET 21 when a zero logic level is generated at output 13. Pull-up circuit 19 has a control input coupled to output 13 and an output coupled to node 23. Pull-up circuit 19 is enabled when the control input (and output 13) is at a zero logic level and disabled when the control input is at a one logic level. Pull-up circuit 19 is coupled to the terminal of second power supply 16 and outputs a one logic level of approximately 5 volts which disables p-channel enhancement MOSFET 21.

Operation and design criteria of inverting digital level translator circuit 11 is best described by showing events which occur when a one logic level and a zero logic level are generated at output 13.

In a first example, assume output 13 is at a zero logic level and the input signal transitions from a one logic level to a zero logic level. N-channel enhancement MOSFET 22 is disabled by the zero logic level of the input signal. The output of inverter 17 transitions to a one logic level enabling transmission gate 18. A contention condition exists at node 23 because pull-up circuit 19 and transmission gate 18 are both enabled, each tries to drive node 23 to a different logic state i.e., a one logic level and a zero logic level respectively. Pull-up circuit 19 is designed to be overcome by enabled transmission gate 18 (and the input signal) thereby driving node 23 to a zero logic level. P-channel enhancement MOSFET 21 is enabled (the gate coupled to node 23) and drives the output to a one logic state (approximately 5 volts). Pull-up circuit 19 is disabled by a one logic state at output 13 thus eliminating the contention condition. Quiescent or static currents in circuit 11 are limited to cutoff device leakage currents when output 13 reaches a one logic level thereby minimizing power consumption.

In a second example, assume output 13 is at a one logic level and the input signal transitions from a zero logic level to a one logic level. Pull-up circuit 19 is disabled by the one logic level at output 13 and node 23 is at a zero logic state (p-channel enhancement MOSFET 21 is enabled). The output of inverter 17 transitions to a zero logic level disabling transmission gate 18. Node 23 remains at the zero logic state temporarily. The one logic level of the input signal enables n-channel enhancement MOSFET 22. A contention condition exists at output 13 because both p-channel enhancement MOSFET 21 and n-channel enhancement MOSFET 22 are enabled and trying to drive output 13 to different logic levels. P-channel enhancement MOSFET 21 is designed to be overdriven by n-channel enhancement MOSFET 22 thereby forcing output 13 to a zero logic level. The geometry of n-channel enhancement MOSFET 22 must be chosen with the knowledge that the maximum enabling input signal received by MOSFET 22 is approximately 3 volts. As output 13 approaches the zero logic state, pull-up circuit 19 is enabled driving node 23 to a one logic level. Node 23 at the one logic level disables p-channel enhancement MOSFET 21 removing the contention condition. Like the first example, quiescent current of circuit 11 is limited to device leakage currents when node 23 is brought to the one logic level by pull-up circuit 19 and the contention condition is eliminated.

Inverting digital voltage level translator circuit 11 maximizes speed by minimizing delay paths for generating a logic level at output 13. A delay for generating a zero logic level at output 13 comprises a delay for n-channel enhancement MOSFET 22 to pull output 13 to the zero logic level (overdriving enabled p-channel enhancement MOSFET 21). A delay for generating a one logic level at output 13 comprises a delay for enabling transmission gate 18, a delay for pulling node 23 to a zero logic level (overdriving enabled pull-up circuit 19), and a delay for p-channel enhancement MOSFET 21 to pull output 13 to a one logic level. Symmetry of delay and rise/fall times for generating the zero and one logic levels can be accomplished by adjusting device geometries (gate channel width (W) vs channel length (L)) and should be based on the characteristics of the devices for a particular semiconductor process flow.

Figure 2:
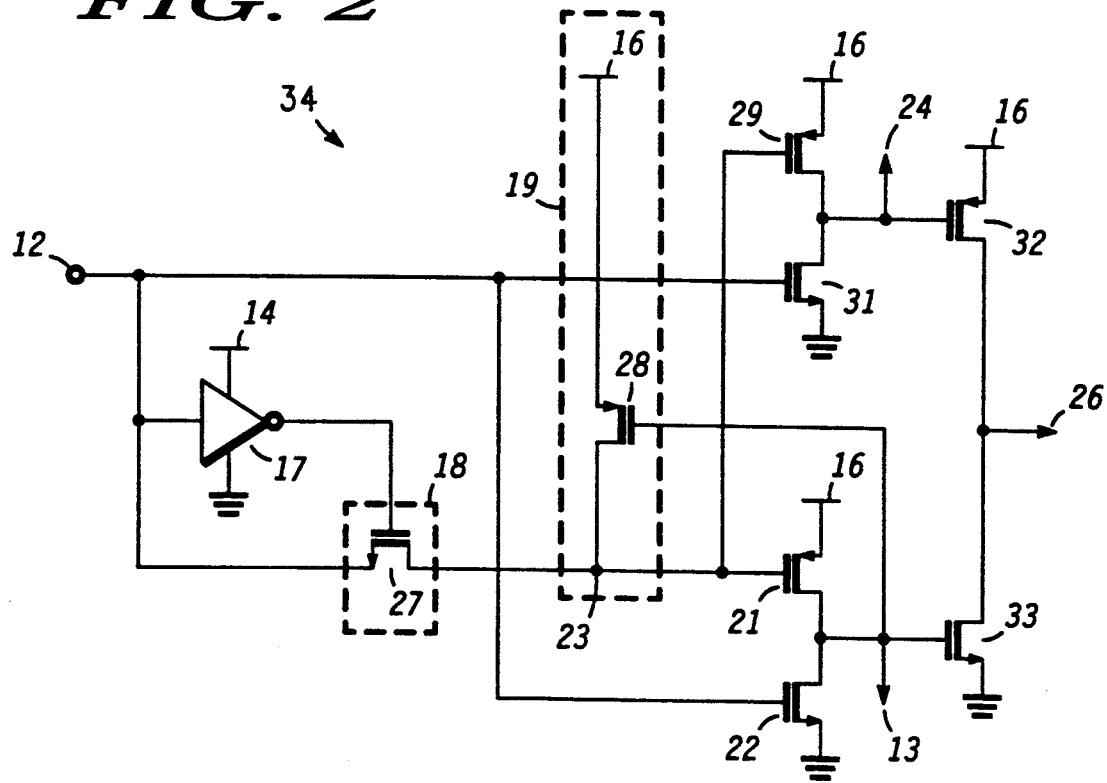
FIG. 2 is a schematic diagram of an embodiment of a digital voltage level translator circuit in accordance with the present invention.

FIG. 2 is a schematic diagram of an embodiment of a digital voltage level translator circuit in accordance with the present invention.

Typical usage of a digital voltage level translator circuit is to interface circuitry operating at two different voltages. A common scenario is interfacing 3 volt digital circuitry to 5 volt digital circuitry. In the preferred embodiment, an integrated circuit is partitioned as follows: 1) a main body of the integrated circuit operates at approximately 3 volts, 2) digital voltage level translator circuits buffer signal lines which leave the main body and increase voltage output swings to approximately five volts, and 3) outputs of the voltage level translator circuits couple to Input/Output circuitry (operating at approximately five volts) for driving elements external to the integrated circuit. In the preferred embodiment, a digital level voltage translator circuit should be small (silicon area), fast, simple, low power, and capable of driving capacitive loads presented by Input/Output circuitry. A non-inverting digital voltage level translator circuit 34 which contains all elements described in FIG. 1 but generates a non-inverting output and is capable of driving larger capacitive loads is illustrated in FIG. 2.

Non-inverting digital voltage level translator circuit 34 has input 12, inverting output 13, an inverting output 24 and a non-inverting output 26 (elements corresponding to like components of FIG. 1 are designated by the same reference numbers). Input 12 receives the input signal which in the preferred embodiment is a digital signal having a one logic level of approximately 3 volts and a zero logic level of zero volts (or ground). The input of inverter 17 is coupled to input 12 while its output is coupled to the control input of transmission gate 18. Inverter 17 is coupled to the terminal of the first power supply 14. First power supply 14 provides a voltage of approximately 3 volts, thus inverter 17 has a maximum output voltage for a one logic level of approximately 3 volts. As mentioned previously, inverter 17 comprises p-channel and n-channel enhancement transistors, cascade coupled to form an inverter which is well known in the circuit design art.

In the preferred embodiment, transmission gate 18 is realized by n-channel enhancement MOSFET 27 having a gate corresponding to the control input, a source corresponding to the input and a drain corresponding to the output. Transmission gate 18 is enabled by inverter 17 when input 12 is at a zero logic level. N-channel enhancement MOSFET 27 is suitable for use as transmission gate 18 since it must pass a zero logic level. MOSFET 27 would be unsuitable for passing a one logic level. MOSFET 27 is disabled by inverter 17 when input 12 is at a one logic state. Two factors play a role in choosing an appropriate geometry (W/L) for MOSFET 27. First, inverter 17 outputs a 3 volt one logic level to enable MOSFET 27. Second, MOSFET 27 must be able to overdrive enabled pull-up circuit 19 and bring node 23 to a zero logic level.

P-channel enhancement MOSFET 21 and n-channel enhancement MOSFET 22 are coupled as described in FIG. 1. Output 13 outputs an inverted signal of the input logic signal. The geometry (W/L) of p-channel enhancement MOSFET 21 is chosen to generate a one logic level at output 13 with a predetermined rise time and delay. The geometry (W/L) of n-channel enhancement MOSFET 22 is chosen to generate a zero logic level at output 13 with a predetermined fall time and delay but two additional factors must be taken into account. First, n-channel enhancement MOSFET 22 is enabled by a one logic level of approximately 3 volts. Second, the geometry of MOSFET 22 must also take into account the fact that MOSFET 21 is enabled when MOSFET 22 is initially enabled thus MOSFET 22 must overdrive MOSFET 21 to generate a zero logic state at output 13.

In the preferred embodiment, pull-up circuit 19 comprises p-channel enhancement MOSFET 28 having a gate corresponding to the control input, a source coupled to the terminal of second power supply 16 and a drain corresponding to the output. The voltage of power supply 16 in this embodiment is approximately 5 volts. A zero logic level at output 13 enables MOSFET 28 to drive node 23 to a one logic level. When the contention condition does not exist (MOSFET 27 and pull-up circuit 19 enabled simultaneously) and MOSFET 28 is enabled, node 23 is driven to a one logic level of approximately 5 volts.

P-channel enhancement MOSFET 29 has a gate coupled to node 23, a source coupled to the terminal of second power supply 16, and a drain coupled to an output 24. A n-channel enhancement MOSFET 31 has a gate coupled to input 12, a source coupled to ground, and a drain coupled to output 24. MOSFETs 29 and 31 are coupled similarly to MOSFETs 21 and 22. Output 24 outputs an inverted signal of the input signal similar to output 13. The geometry (W/L) of p-channel enhancement MOSFET 29 is chosen to drive output 24 to a one logic level at a predetermined rise time and delay. The geometry (W/L) of n-channel enhancement MOSFET 31 is chosen to drive output 24 to a zero logic level (at a predetermined fall time and delay) but must overcome a contention condition. The contention condition occurs when both MOSFET 29 and 31 are enabled simultaneously and MOSFET 31 must overdrive MOSFET 29 to generate the logic zero level at output 24.

A n-channel enhancement MOSFET 33 has a gate coupled to output 13, a source coupled to ground, and a drain coupled to a non-inverting output 26. A p-channel enhancement MOSFET 32 has a gate coupled to output 24, a source coupled to a terminal of second power supply 16, and a drain coupled to non-inverting output 26. MOSFETs 32 and 33 form an inverter which acts as an output stage for non-inverting digital voltage level translator circuit 34. MOSFETs 21 and 22 corresponds to a predriver stage for MOSFET 33. MOSFETs 29 and 31 corresponds to a predriver stage for MOSFET 32. Functionally, MOSFETs 29 and 31 are not needed to drive the output stage but they provide an added degree of adjustment to circuit 34 for fine tuning on/off characteristics of MOSFET 32. Likewise, MOSFETs 21 and 22 can be used to control on/off characteristics of MOSFET 33.

Operation of non-inverting digital voltage level translator circuit 34 is very simple. A description of events which occur during generation of a one or zero logic level at output 26 should illustrate delay paths through circuit 34.

In a first example, prior to an input signal transition, assume that the input signal is at a one logic level, output 26 is at a one logic level, MOSFET 27 is disabled, output 13 is at a zero logic level and MOSFET 28 is enabled holding node 23 at a one logic level. As the input signal transitions input 12 from a one logic level to a zero logic level MOSFETs 22 and 31 are then disabled. The delay path comprises the following events: 1) inverter 17 enables MOSFET 27, 2) MOSFET 27 transfers a zero logic level to node 23 overdriving enabled MOSFET 28, 3) MOSFETs 21 and 29 are enabled generating a one logic level at outputs 13 and 24 respectively, 4) output 13 transitioning to the one logic level disables MOSFET 28 removing the contention condition, 5) MOSFET 32 is disabled by the one logic level at output 24, and 6) MOSFET 33 is enabled by the one logic level at output 13 generating a zero logic level at non-inverting output 26.

In a second example, prior to an input signal transition, the input signal is at a zero logic level, output 26 is at a zero logic level, MOSFET 27 is enabled holding node 23 at a zero logic level, outputs 13 and 24 are at a one logic level, and MOSFET 28 is disabled. The input signal then transitions input 12 from the zero logic state to a one logic state. Inverter 17 disables MOSFET 27, node 23 is floating but remains at the zero logic level. The delay path comprises the following events: 1) MOSFETs 22 and 31 are enabled by input 12 at the one logic level generating a zero logic level at output 13 and 24 respectively (MOSFET 22 must overdrive the enabled MOSFET 21 and MOSFET 31 must overdrive the enabled MOSFET 29), 2) output 13 transitioning to the zero logic level enables MOSFET 28 to generate a one logic level at node 23 disabling MOSFETs 21 and 29, 3) the zero logic level at output 13 disables MOSFET 33, and 4) the zero logic level at output 24 enables MOSFET 32 generating a one logic level at non-inverting output 26.

As mentioned previously, delay paths for the two examples sited above are optimized by adjusting MOSFET geometries to create the desired response from non-inverting digital voltage level translator circuit 34. The simplicity of the circuit minimizes delay by virtue of the small number of gates in each delay path.

By now it should be appreciated that a digital voltage level translator circuit has been described which buffers and converts an input digital signal of a first voltage to an output signal of a second voltage. The digital voltage level translator circuit is typically used as an interface for signals coupling between circuitry operating at two different voltages and provides advantages such as simplicity, low silicon overhead, high speed, and low quiescent current.

We claim:

1. A digital voltage level translator circuit responsive to an input digital signal of a first logic level for providing an output digital signal of a second logic level comprising:

an inverter having an input and an output, said input receiving the input digital signal;

a transmission gate having an input receiving said input digital signal, a control input coupled to said output of said inverter, and an output;

an enhancement MOSFET of a first conductivity type having a gate coupled to said output of said transmission gate, a source coupled to a terminal of a first power supply, and a drain coupled to an output of said digital voltage level translator circuit;

an enhancement MOSFET of a second conductivity type having a gate receiving said input digital signal, a source coupled to ground, and a drain coupled to said output of said digital voltage level translator circuit; and a pull up circuit having a control input coupled to said output of said digital voltage level translator circuit and an output coupled to said output of said transmission gate, wherein a one logic level of the input digital signal is at a substantially lower voltage than a one logic level of the output digital signal.

2. The digital voltage level translator circuit of claim 1 wherein said inverter comprises:

a p-channel enhancement MOSFET having a gate coupled to said input of said inverter, a source coupled to a second power supply, and a drain coupled to said output of said inverter; and a n-channel enhancement MOSFET having a gate coupled to said input of said inverter, a source coupled to ground, and a drain coupled to said output of said inverter.

3. The digital voltage level translator circuit of claim 2 wherein said second power supply provides a voltage lower than the voltage provided by said first power supply.

4. The digital voltage level translator circuit of claim 1 wherein said transmission gate comprises a enhancement MOSFET of said second conductivity type having a source corresponding to said input, a gate corresponding to said control input, and a drain corresponding to said output.

5. A circuit for translating an input digital logic signal of a first voltage to an output digital logic signal of a second voltage comprising:

an inverter having an input and an output, said input receives a digital logic signal of a first voltage level;

a first n-channel enhancement MOSFET having a gate coupled to said output of said inverter, a source coupled to said input of said inverter, and a drain;

a first p-channel enhancement MOSFET having a gate coupled to said drain of said first n-channel enhancement MOSFET, a source coupled to a terminal of a power supply, and a drain coupled to an inverting output of the circuit at which the output digital logic signal is provided;

a second n-channel enhancement MOSFET having a gate coupled to said input of said inverter, a source coupled to ground, and a drain coupled to said inverting output; and a second p-channel enhancement MOSFET having a gate coupled to said inverting output, a source coupled to said terminal of said power supply, and a drain coupled to said drain of said first n-channel enhancement MOSFET.

6. The circuit of claim 5 wherein the inverter comprises:

a p-channel enhancement MOSFET having a gate coupled to said input of said inverter, a source coupled to an additional power supply, and a drain coupled to said output of said inverter; and a n-channel enhancement MOSFET having a gate coupled to said input of said inverter, a source coupled to ground, and a drain coupled to said output of said inverter.

7. The circuit of claim 6 wherein said additional power supply provides a voltage lower than the voltage provided by said power supply.

8. The circuit of claim 5 wherein a one logic level of the digital logic signal is different than a one logic level of the output digital signal.

9. The circuit of claim 5 further including:

a third p-channel enhancement MOSFET having a gate coupled to said drain of said first n-channel enhancement MOSFET, a source coupled to said terminal of said power supply, and a drain coupled to a second output; and a third n-channel enhancement MOSFET having a gate coupled to said input of said inverter, a source coupled to ground, and a drain coupled to said second output.

10. The circuit of claim 9 further including:

a fourth p-channel enhancement MOSFET having a gate coupled to said second output, a source coupled to said terminal of said power supply, and a drain coupled to a non-inverting output of the circuit; and a fourth n-channel enhancement MOSFET having a gate coupled to said inverting output, a source coupled to ground, and a drain coupled to said non-inverting output.

11. A buffer circuit comprising:

an inverter having an input and an output wherein said input receiving an input signal;

a first n-channel enhancement MOSFET having a gate coupled to said output of said inverter, a source coupled to said input of said inverter for receiving said input signal, and a drain;

a first p-channel enhancement MOSFET having a gate coupled to said drain of said first n-channel enhancement MOSFET, a source coupled to a terminal of a power supply, and a drain coupled to a first inverting output;

a second n-channel enhancement MOSFET having a gate coupled to said input of said inverter for receiving said input signal, a source coupled to ground, and a drain coupled to said first inverting output;

a second p-channel enhancement MOSFET having a gate coupled to said first inverting output, a source coupled to said terminal of said power supply, and a drain coupled to said drain of said first n-channel enhancement MOSFET;

a third p-channel enhancement MOSFET having a gate coupled to said drain of said first n-channel enhancement MOSFET, a source coupled to said terminal of said power supply, and a drain coupled to a second inverting output;

a third n-channel enhancement MOSFET having a gate coupled to said input of said inverter for receiving said input signal, a source coupled to ground, and a drain coupled to said second inverting output;

a fourth p-channel enhancement MOSFET having a gate coupled to said second inverting output, a source coupled to said terminal of said power supply, and a drain coupled to an output of the buffer circuit; and a fourth n-channel enhancement MOSFET having a gate coupled to said first inverting output, a source coupled to ground, and a drain coupled to said buffer circuit output.

12. The buffer circuit of claim 11 wherein the inverter comprises:

a p-channel enhancement MOSFET having a gate coupled to said input of said inverter, a source coupled to an additional power supply, and a drain coupled to said output of said inverter; and a n-channel enhancement MOSFET having a gate coupled to said input of said inverter, a source coupled to ground, and a drain coupled to said output of said inverter.

13. The buffer circuit of claim 11 wherein said additional power supply provides a voltage lower than the voltage provided by said power supply.

14. The buffer circuit of claim 11 wherein said input signal has a one logic level which is different than a one logic level at said buffer circuit output.

15. The buffer circuit of claim 14 wherein said one logic level of said input signal must be greater than a threshold voltage of said second and third n-channel enhancement MOSFETs.

* * * * *